US012681061B2

(12) United States Patent
Cao et al.

(10) Patent No.: US 12,681,061 B2
(45) Date of Patent: Jul. 14, 2026

(54) WIRELESS ELECTRICAL SENSOR AND ELECTRICAL PARAMETER MEASUREMENT AND CALCULATION APPARATUS, METHOD AND SYSTEM

(71) Applicant: ACCUPOWER ELECTRONIC TECHNOLOGIES CO., LTD. OF TAIYUAN, Taiyuan (CN)

(72) Inventors: Rui Cao, Taiyuan (CN); Jiang Chen, Taiyuan (CN); Yanjun Song, Taiyuan (CN)

(73) Assignee: ACCUPOWER ELECTRONIC TECHNOLOGIES CO., LTD. OF TAIYUAN, Taiyuan (CN)

( * ) Notice: Subject to any disclaimer, the term of this patent is extended or adjusted under 35 U.S.C. 154(b) by 320 days.

(21) Appl. No.: 18/566,320

(22) PCT Filed: Jan. 28, 2022

(86) PCT No.: PCT/CN2022/074663
§ 371 (c)(1),
(2) Date: Dec. 1, 2023

(87) PCT Pub. No.: WO2022/252664
PCT Pub. Date: Dec. 8, 2022

(65) Prior Publication Data
US 2024/0310417 A1 Sep. 19, 2024

(30) Foreign Application Priority Data
Jun. 2, 2021 (CN) .......................... 202110614608.3

(51) Int. Cl.
G01R 21/06 (2006.01)
G01R 15/18 (2006.01)
(Continued)

(52) U.S. Cl.
CPC ........... G01R 21/06 (2013.01); G01R 15/186 (2013.01); G01R 19/255 (2013.01); G08C 17/02 (2013.01); *G01R 35/04* (2013.01)

(58) Field of Classification Search
CPC .... G01R 21/06; G01R 15/186; G01R 19/255; G01R 35/04; G01R 19/2509; G01R 22/063; G01R 19/25; G08C 17/02
(Continued)

(56) References Cited

U.S. PATENT DOCUMENTS 9,784,773 B2 * 10/2017 Deokar ................... H01F 38/28
2011/0006756 A1 1/2011 Rosewell et al.
(Continued)

FOREIGN PATENT DOCUMENTS

CN 102141586 A 8/2011
CN 103189753 A 7/2013
(Continued)

OTHER PUBLICATIONS

Extended Search Report issued on May 8, 2025, in corresponding European Application No. 22814713.8, 8 pages.
(Continued)

*Primary Examiner* — Arleen M Vazquez
*Assistant Examiner* — Robert P Alejnikov, Jr.
(74) *Attorney, Agent, or Firm* — Maier & Maier, PLLC

(57) ABSTRACT

An electrical parameter measurement and calculation apparatus, method, and system, and a wireless electrical sensor. The calculation apparatus includes a first electrical signal acquisition module, a first wireless module and an electrical parameter calculation module, where the first wireless module receives a first electrical signal in a wireless manner and transmits the first electrical signal to the electrical parameter calculation module; the first electrical signal acquisition module acquires and transmits a second electrical signal to
(Continued)

the electrical parameter calculation module; and the electrical parameter calculation module calculates electrical parameter information according to the first electrical signal and the second electrical signal. According to the wireless electrical sensor and the electrical parameter measurement and calculation apparatus, method and system, first, the use of test wires is reduced; second, the number of wireless modules used is reduced; and time information of signal sampling is synchronized, thereby realizing high-precision electrical parameter measurement.

9 Claims, 4 Drawing Sheets

(51) Int. Cl.
  G01R 19/255        (2006.01)
  G01R 35/04         (2006.01)
  G08C 17/02         (2006.01)
(58) Field of Classification Search
  USPC ....................................................... 324/76.11
  See application file for complete search history.

(56)                   References Cited

U.S. PATENT DOCUMENTS

| | | | |
|---|---|---|---|
| 2016/0274153 | A1 | 9/2016 | Deokar et al. |
| 2019/0113551 | A1* | 4/2019 | Stenberg ................ G01R 22/10 |
| 2019/0392002 | A1 | 12/2019 | Lavasani et al. |
| 2021/0055333 | A1* | 2/2021 | Mobley .............. G01R 19/2513 |
| 2022/0070801 | A1 | 3/2022 | Satoh |

FOREIGN PATENT DOCUMENTS

| | | | | |
|---|---|---|---|---|
| CN | 105116190 | A | 12/2015 | |
| CN | 105842649 | A * | 8/2016 | ............ G01R 35/04 |
| CN | 107219386 | A | 9/2017 | |
| CN | 107843868 | A | 3/2018 | |
| CN | 111766436 | A | 10/2020 | |
| CN | 111783966 | A | 10/2020 | |
| CN | 112734040 | A | 4/2021 | |
| CN | 112881794 | A | 6/2021 | |
| CN | 112947935 | A | 6/2021 | |
| CN | 113095474 | A | 7/2021 | |
| CN | 216144942 | U | 3/2022 | |
| EP | 3252907 | A1 | 12/2017 | |
| JP | 2009222433 | A | 10/2009 | |
| JP | 2010008108 | A | 1/2010 | |
| JP | 2020529162 | A | 10/2020 | |
| WO | 2016121405 | A1 | 8/2016 | |
| WO | 2019022794 | A1 | 1/2019 | |
| WO | 2020149103 | A1 | 7/2020 | |
| WO | 2021114530 | A1 | 6/2021 | |

OTHER PUBLICATIONS

Office Action issued on Jun. 17, 2025, in corresponding Japanese Application No. 2023-575448, 11 pages.
Supplementary Search Report issued on Jan. 12, 2024, in corresponding Chinese Application No. 2021106146083, 4 pages.
Office Action issued on Jan. 12, 2024, in corresponding Chinese Application No. 202110614608.3, 30 pages.
Office Action issued on Nov. 19, 2024, in corresponding Japanese Application No. 2023-575448, 10 pages.
International Search Report issued on Nov. 30, 2022, in corresponding International Application No. PCT/CN2022/116199, 5 pages.

* cited by examiner

Device with electrical parameter measurement and/or electricity
meter calibration functions Wireless current sensor          First current I1

Electrical
parameter
measurement and
calculation
apparatus

Wireless current sensor          Second current I2

Wireless current sensor          Third current I3

Three voltages U

Electric energy pulse

User terminal

Marketing system

Fig. 7

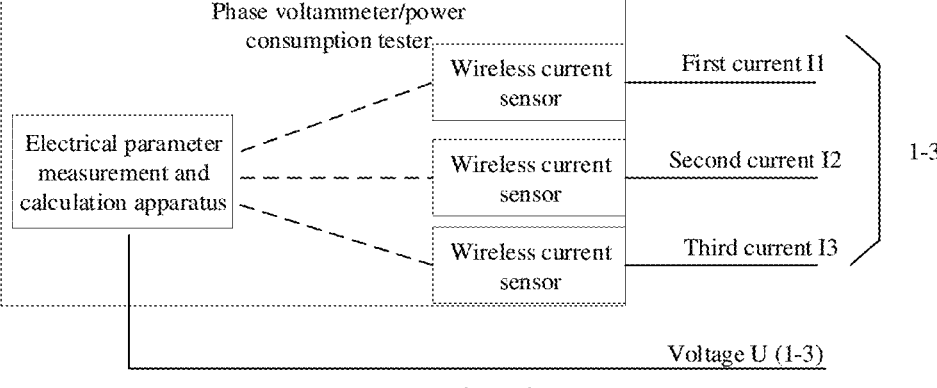

Phase voltammeter/power
consumption tester

Wireless current
sensor          First current I1

Electrical parameter
measurement and
calculation apparatus

Wireless current
sensor          Second current I2          1-3

Wireless current
sensor          Third current I3

Voltage U (1-3)

Fig. 8

WIRELESS ELECTRICAL SENSOR AND ELECTRICAL PARAMETER MEASUREMENT AND CALCULATION APPARATUS, METHOD AND SYSTEM

TECHNICAL FIELD

The application relates to the field of electric power, in particular to a wireless electrical sensor, and an electrical parameter measurement and calculation apparatus, method and system.

BACKGROUND

A traditional electricity meter field calibrator (or electrical parameter measurement device) needs to be equipped with 1 to 3 current clamps (or current sensors), and a tested current signal is transmitted back to the electricity meter field calibrator through wires. However, a test wire of the current clamp is about 2 meters long, so the test distance is limited; the test wires of multiple current clamps often become tangled, causing inconvenience to operators; additionally, an insulation layer of the test wire is susceptible to damage due to both human and natural factors, which may result in electrical leakages, interphase short circuits, or other serious consequences. At present, the electricity meter field calibrator cannot acquire current signals in a wireless manner by the current clamps, not to mention wireless transmission realized by multiple current clamps acquiring current signals synchronously.

SUMMARY

Aiming at the problems in the prior art, the application provides a wireless electrical sensor, and an electrical parameter measurement and calculation apparatus, method and system. The electrical parameter measurement and calculation apparatus is equipped with a wireless module to receive electrical signals (such as current or voltage) transmitted by other electrical acquisition units (such as current sensors or voltage sensors) through wireless transmission, thereby reducing the use of test wires.

According to a first aspect of the invention, an electrical parameter measurement and calculation apparatus is provided, comprising a first electrical signal acquisition module, a first wireless module and an electrical parameter calculation module, wherein the first wireless module receives a first electrical signal in a wireless manner and transmits the first electrical signal to the electrical parameter calculation module;

the first electrical signal acquisition module acquires a second electrical signal and transmits the second electrical signal to the electrical parameter calculation module; and the electrical parameter calculation module calculates electrical parameter information according to the first electrical signal and the second electrical signal.

According to a second aspect of the invention, an electrical parameter measurement and calculation method is provided, comprising:

receiving a first electrical signal in a wireless manner;

acquiring a second electrical signal; and calculating electrical parameter information according to the first electrical signal and the second electrical signal.

According to a third aspect of the invention, a wireless electrical sensor is provided, comprising:

a second electrical signal acquisition module used for acquiring a first electrical signal; and a second wireless module used for receiving the acquired first electrical signal and transmitting the acquired first electrical signal in a wireless manner.

According to a fourth aspect of the invention, an electrical parameter measurement and calculation system is provided, comprising the electrical parameter measurement and calculation apparatus according to the first aspect and the wireless electrical sensor according to the third aspect.

The wireless electrical sensor, and the electrical parameter measurement and calculation apparatus, method and system provided by the invention have the following beneficial effects.

(1) The wireless module is used for receiving electrical signals, which changes the usual practice of acquiring current/voltage signals with wired current/voltage sensors; and the use of test wires is reduced, and the distance to a current and voltage test point is no longer limited by cable length, allowing for the selection of a point that provides optimal signal acquisition, which makes operation easier, and at the same time avoids potential safety hazards caused by the tangling of test wires and the damage of insulation layers of the test wires.

(2) The electrical parameter measurement and calculation apparatus comprises modules for acquiring part of the electrical signals, so that the acquisition and transmission of the electrical signals are completed in the apparatus; compared with a traditional electrical parameter measurement device, the use of test wires is reduced, which further reduces the delay and loss caused by signal transmission; compared with electrical signal transmission by the wireless module, the transmission of this part of electrical signals does not need the wireless module, so that the wireless transmission volume of the whole apparatus is reduced by 50%; in this way, power consumption is reduced, the size is reduced, the layout of the whole electrical parameter measurement and calculation apparatus or system is more concise, the system is less complicated, the communication between modules in the system is simpler and more efficient, and the cost of the system is reduced.

(3) Synchronous signal sampling time information is shared by the electrical parameter measurement and calculation apparatus and the wireless module or wireless synchronization unit of the wireless electrical sensor, so as to realize synchronous sampling of the first electrical signal and the second electrical signal; the wireless module or wireless synchronization unit adopts universal GNSS timing or 5G timing, which can ensure that received time sources are consistent; and when the wireless module or wireless synchronization unit uses local clock information in the form of pulses and/or timestamps, small jitters (for example, within 10 $\mu$s) and small time delays are realized, and the time error between the clock information received and restored at one end and the local clock information sent is less than 20 $\mu$s, so that high-precision electrical parameter information can be obtained, for example, the measurement accuracy of power and/or electric energy is over 2%.

(4) The wireless module or wireless synchronization unit supports the synchronization of signal sampling time information by using local clock information, thus avoiding the situation that equipment cannot be used due to the failure to receive satellite timing in a harsh environment.

(5) The wireless module or wireless transmission unit supports the wireless transmission of signals by using a custom wireless transmission protocol, thus avoiding the situation that equipment cannot be used because network signals cannot be received in a harsh environment.

(6) The electrical signal acquisition module in the electrical parameter measurement and calculation apparatus can be either a voltage acquisition module or a current acquisition module, and users can make flexible choices as needed.

(7) The electrical parameter measurement and calculation apparatus features a voltage acquisition module that can acquire the voltages of multiple lines by sharing a common voltage reference point, thus having a wide application range, covering single-phase electricity meters, three-phase three-wire electricity meters, three-phase four-wire electricity meters, phase voltammeters in three-phase three-wire distribution systems and phase voltammeters in three-phase four-wire distribution systems.

BRIEF DESCRIPTION OF THE DRAWINGS

In order to explain the technical scheme in the embodiments of the application more clearly, the drawings used in the description of the embodiments will be briefly introduced below. Obviously, the drawings in the following description are only for some embodiments of the application. For those of ordinary skill in the art, other drawings can be obtained from these drawings without exceeding the protection scope of this application.

FIG. 7 is a structural diagram of another high-precision device with electrical parameter measurement and/or electricity meter calibration functions according to an embodiment of the invention.

FIG. 8 is a structural diagram of a phase voltammeter according to an embodiment of the invention.

DETAILED DESCRIPTION OF EMBODIMENTS

Figure 1:
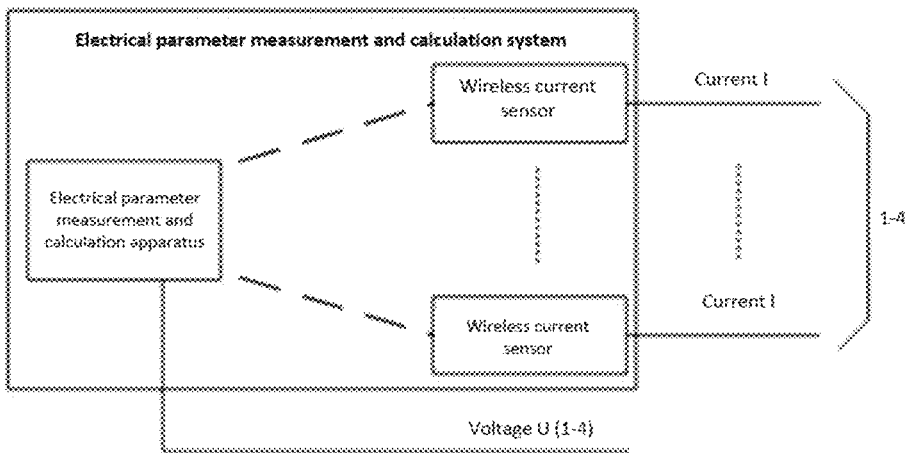
FIG. 1 is a diagram of an electrical parameter measurement and calculation system according to an embodiment of the invention.

The technical schemes in the embodiments of the application will be clearly and completely described below in combination with attached drawings. Obviously, the described embodiments are part of the embodiments of the application, not all of them. Based on the embodiments of the application, all other embodiments obtained by those skilled in the art without making creative labor belong to the scope of protection of the application.

An electrical parameter measurement and calculation apparatus described in the invention can be any device for measuring electricity consumption, including but not limited to an electricity meter calibrator, a phase voltammeter, a power analyzer, a portable PMU synchronous vector measurement apparatus, a power quality analyzer, a power consumption tester, a six-way differential protection vector tester, a double clamp grounding resistance tester, a storage recorder, a portable multifunctional electricity meter, an oscilloscope, and a digital multimeter.

A wireless electrical sensor described in the invention can be any sensor that acquires voltage and/or current signals, including but not limited to a current clamp, a flexible current probe, and a flexible Rogowski coil.

The process used to conceive this invention is as follows.

A traditional electrical parameter measurement and calculation apparatus is connected with a detected object using voltage test wires and current test wires. A terminal end of the voltage test wire is connected with the electrical parameter measurement and calculation apparatus, and a crocodile clip end is connected with the detected object to obtain a voltage signal. A terminal end of the current test wire is connected with the electrical parameter measurement and calculation apparatus, and a current clamp end is connected with the detected object to obtain a current signal. The voltage test wire and current test wire are about 2 meters long, and it is time-consuming and laborious to find corresponding terminals or clips when connecting the test wires. After all wires in the device are connected, it is difficult to locate one specific test wire due to the large number of wires present on site.

Improvement 1: In view of the inconvenience brought by a plurality of test wires in the traditional practice, the inventor proposed a wireless solution for improvement, in which each test wire is replaced by a sensor device. For example, a whole device comprises three voltage sensors (six wire clips), three current sensors and a calculation apparatus, and each sensor comprises a wireless module to realize wireless signal transmission and signal time synchronization with the calculation apparatus. Although this solution reduces the total number of test wires, it results in a larger number of wireless modules, leading to increased transmission capacity, wider bandwidths, and elevated power usage. Moreover, a current signal can be acquired by establishing a current loop or current clamp around a transmission line, whereas obtaining a voltage signal requires sharing a common voltage reference point, which implies that all three voltage sensor wire clips share the same reference point, leading to clip congestion and other associated concerns.

Improvement 2: On the basis of Improvement 1, the inventor came up with a feasible scheme to reduce the number of wireless modules and avoid the congestion of wire clips. If three current sensors are integrated into one current sensor, the number of wireless modules will be reduced by two; and if three voltage sensors are integrated into one voltage sensor, the number of wireless modules will be reduced by two and the number of wire clips of the voltage sensors can be reduced from six to four. Based on this consideration, the inventor integrated three voltage sensors into one voltage sensor, that is, the whole device comprises one voltage sensor, three current sensors and a calculation apparatus, so that the number of wireless modules is reduced by two, and the number of wire clips of the voltage sensors is reduced from six to four; in this way, the acquisition of three voltage signals is realized, and the number of measurement signal points is reduced. Although this scheme was further improved on the basis of Improvement 1 by reducing the number of voltage sensors by two and the number of wireless modules by two accordingly, the total voltage signal data transmission volume has not been reduced, and the problems of high bandwidth and great power consumption still persist.

Improvement 3: On the basis of Improvement 2, in order to further solve the problem of high voltage signal data transmission volume, the inventor considered integrating the calculation apparatus with the sensors therein, so that the data generated by these sensors do not need to be transmitted in a wireless manner. On the one hand, the voltage sensor transmits three voltage signals and one current sensor transmits one current signal, so considering the different data transmission volumes, it is more efficient to integrate the voltage sensor in the calculation apparatus. On the other hand, considering the varying requirements for the layout of test wires during voltage and current acquisition processes, it is possible for voltages to differ across different positions of a line in the case of acquisition of multiple voltages, due to the voltage drop of the line. Therefore, during voltage acquisition, it is optimal to acquire multiple voltages at positions as close as possible to a measured object; however, in the case of current acquisition from multiple lines, acquisition points can be farther apart since the same current flows through the same transmission line. Based on this consideration, a voltage sensor is integrated in the calculation apparatus. As a result, the existing inventive concept is formed, that is, the whole device comprises three current sensors and a calculation apparatus. The current sensors send acquired current signals to the calculation apparatus through wireless modules, a voltage acquisition module is integrated in the calculation apparatus, and the voltage of a nearest position of the measured object is directly measured through a test wire of the voltage acquisition module. Thus, the number of wireless modules of the whole device is reduced from four to three, and the signal transmission volume is reduced by 50%, which greatly improves the transmission efficiency of the whole device.

When one electrical signal needs to be acquired, the calculation apparatus can feature either the integration of the voltage sensor and the wireless current sensor or the integration of the current sensor and the wireless voltage sensor.

Based on the above inventive concept, the application provides a wireless electrical sensor, and an electrical parameter measurement and calculation apparatus, method and system. The electrical parameter measurement and calculation apparatus is equipped with a wireless module to receive electrical signals (such as current or voltage) transmitted by other electrical signal acquisition units (such as current sensors or voltage sensors) through wireless transmission, thereby reducing the use of test wires, facilitating the operation of workers, and avoiding potential safety hazards caused by the tangling of test wires and the damage of insulation layers of the test wires. Further, the wireless module realizes signal sampling time synchronization of a first electrical signal and a second electrical signal, so that high-precision electrical parameter information can be obtained.

FIG. 1 is a diagram of an electrical parameter measurement and calculation system according to an embodiment of the invention. As shown in FIG. 1, the system comprises an electrical parameter measurement and calculation apparatus and wireless current sensors, wherein a corresponding number of wireless current sensors are equipped according to the number of circuits to be measured. For example, if the number of circuits to be measured is 1, one wireless current sensor will be equipped, and if the number of circuits to be measured is 2, two wireless current sensors will be equipped.

Figure 2:
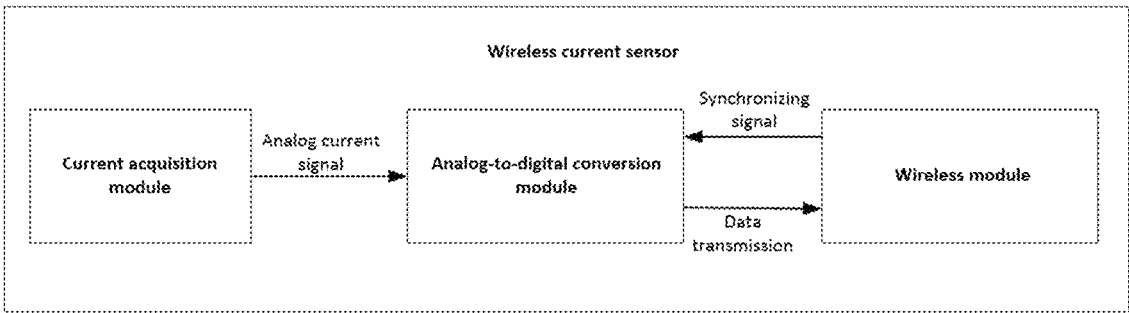
FIG. 2 is a structural diagram of a wireless current sensor according to an embodiment of the invention.

FIG. 2 is a structural diagram of a wireless current sensor according to an embodiment of the invention. As shown in FIG. 2, the wireless current sensor comprises a current acquisition module, an analog-to-digital conversion module and a wireless module. The current acquisition module acquires a current signal of a line and sends the analog current signal to the analog-to-digital conversion module. The analog-to-digital conversion module receives a time signal of the wireless module. The wireless module ensures signal sampling time synchronization of the current signal by: Global Navigation Satellite System (GNSS) timing; 5G timing; sending local clock information to an opposite wireless module by the wireless module; or receiving local clock information from an opposite wireless module by the wireless module.

The analog-to-digital conversion module converts the analog current signal into a digital current signal under synchronous signal sampling information, and sends the digital current signal to the wireless module, and the wireless module sends the current signal to the electrical parameter measurement and calculation apparatus. In one embodiment, the wireless module sends the current signal in a wireless manner through Bluetooth, 2G, 3G, 4G, 5G, WIFI, sub1G, ZigBee or a custom wireless transmission protocol.

Figure 3:
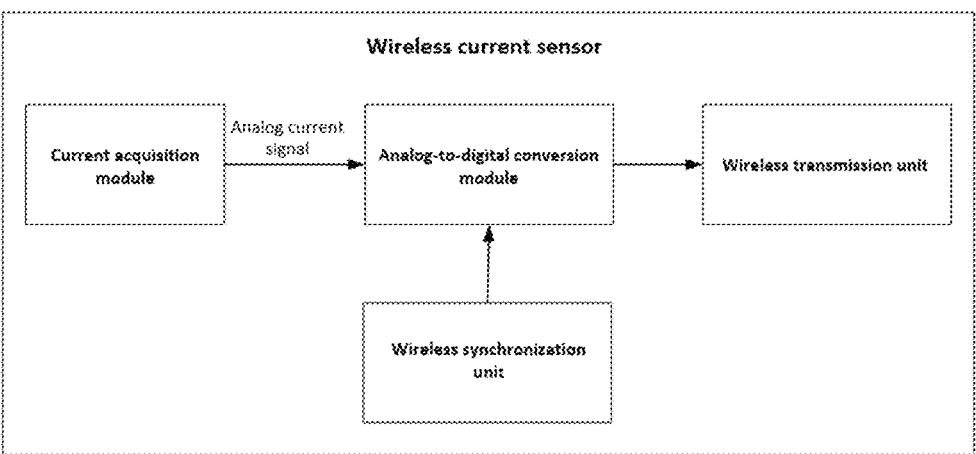
FIG. 3 is a structural diagram of another wireless current sensor according to an embodiment of the invention.

FIG. 3 is a structural diagram of another wireless current sensor according to an embodiment of the invention. As shown in FIG. 3, the wireless current sensor comprises a current acquisition module, an analog-to-digital conversion module and a wireless module, wherein the wireless module comprises a wireless transmission unit and a wireless synchronization unit. The current acquisition module acquires a current signal of a line and sends an analog current signal to the analog-to-digital conversion module. The analog-to-digital conversion module receives a time signal of the wireless synchronization unit, wherein the wireless synchronization unit ensures signal sampling time synchronization of the current signal by GNSS timing; 5G timing; sending local clock information to an opposite wireless synchronization unit by the wireless synchronization unit; or receiving local clock information from an opposite wireless synchronization unit by the wireless synchronization unit.

The analog-to-digital conversion module converts the analog current signal into a digital current signal under synchronous signal sampling information, and sends the digital current signal to the wireless transmission unit, and the wireless transmission unit sends the current signal to the electrical parameter measurement and calculation apparatus. In one embodiment, the wireless transmission unit sends the current signal in a wireless manner through Bluetooth, 2G, 3G, 4G, 5G, WIFI, sub1G, ZigBee or a custom wireless transmission protocol.

Figure 4:
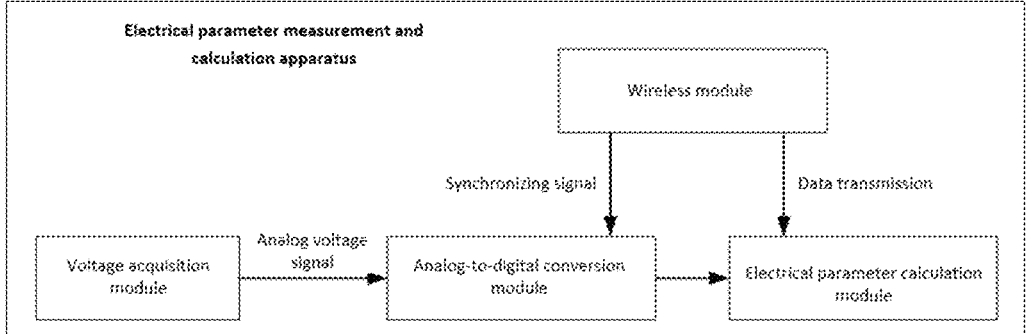
FIG. 4 is a structural diagram of an electrical parameter measurement and calculation apparatus according to an embodiment of the invention.

FIG. 4 is a structural diagram of an electrical parameter measurement and calculation apparatus according to an embodiment of the invention. As shown in FIG. 4, the electrical parameter measurement and calculation apparatus comprises a voltage acquisition module, a wireless module, an analog-to-digital conversion module and an electrical parameter calculation module. In the embodiment shown in FIG. 4, the wireless module receives a current signal from the wireless current sensor in a wireless manner and transmits the current signal to the electrical parameter calculation module; the voltage acquisition module acquires a voltage signal and transmits the voltage signal to the analog-to-digital conversion module, and the analog-to-digital conversion module receives a time signal of the wireless module, converts an analog voltage signal into a digital voltage signal under synchronous signal sampling information, and sends the digital voltage signal to the electrical parameter calculation module; and the electrical parameter calculation module calculates electrical parameter information according to the received current signal and voltage signal.

In the embodiment shown in FIG. 4, the wireless module receives the current signal in a wireless manner through Bluetooth, 2G, 3G, 4G, 5G, WIFI, sub1G, ZigBee or a custom wireless transmission protocol.

In the embodiment shown in FIG. 4, the wireless module ensures signal sampling time synchronization of the current signal and the voltage signal by GNSS timing; 5G timing; sending local clock information to an opposite wireless module by the wireless module; or receiving local clock information from an opposite wireless module by the wireless module.

In the embodiment shown in FIG. 4, the current signal used for calculating the electrical parameter information comes from the wireless current sensor, the wireless current sensor sends the acquired current signal to the electrical parameter measurement and calculation apparatus in a wireless manner, and the wireless module of the electrical parameter measurement and calculation apparatus receives the current signal. In the embodiment shown in FIG. 4, the voltage signal used for calculating the electrical parameter information comes from the voltage acquisition module integrated in the electrical parameter measurement and calculation apparatus, and the voltage acquisition module obtains a voltage of a circuit through test wires. In the case of measuring the voltages of multiple lines, the voltage acquisition module comprises a plurality of measurement points which can acquire the voltages of multiple lines by sharing a common voltage reference point. For example, a three-phase three-wire electricity meter uses one of the voltage lines as a common voltage line, a single-phase electricity meter and a three-phase four-wire electricity meter use a neutral wire as a common voltage line, a phase voltammeter in a three-phase three-wire distribution system uses one of the voltage lines as a common voltage line, and a phase voltammeter in a three-phase four-wire distribution system uses a neutral wire as a common voltage line. There are many ways to share a common voltage reference point, which are not listed here. The electrical parameter calculation module directly obtains the voltage signal acquired by the voltage acquisition module. Here, the voltage acquisition module can be a voltage sensor.

Figure 5:
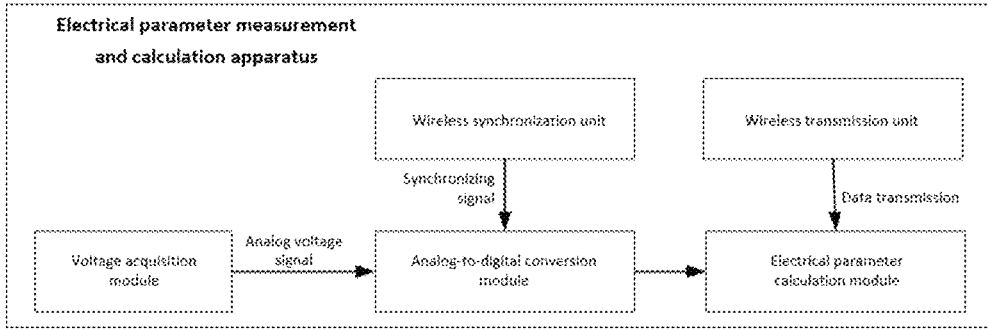
FIG. 5 is a structural diagram of another electrical parameter measurement and calculation apparatus according to an embodiment of the invention.

FIG. 5 is a structural diagram of another electrical parameter measurement and calculation apparatus according to an embodiment of the invention. As shown in FIG. 5, the electrical parameter measurement and calculation apparatus comprises a voltage acquisition module, a wireless module, an analog-to-digital conversion module and an electrical parameter calculation module. The wireless module comprises a wireless transmission unit and a wireless synchronization unit. In the embodiment shown in FIG. 5, the wireless transmission unit receives a current signal from the wireless current sensor in a wireless manner and transmits the current signal to the electrical parameter calculation module; the voltage acquisition module acquires a voltage signal and transmits the voltage signal to the analog-to-digital conversion module, and the analog-to-digital conversion module receives a time signal of the wireless synchronization unit, converts an analog voltage signal into a digital voltage signal under synchronous signal sampling information, and sends the digital voltage signal to the electrical parameter calculation module; and the electrical parameter calculation module calculates electrical parameter information according to the received current signal and voltage signal.

In the embodiment shown in FIG. 5, the wireless transmission unit receives the current signal in a wireless manner through Bluetooth, 2G, 3G, 4G, 5G, WIFI, sub1G, ZigBee or a custom wireless transmission protocol.

In the embodiment shown in FIG. 5, the wireless synchronization unit ensures signal sampling time synchronization of the current signal and the voltage signal by GNSS timing; 5G timing; sending local clock information to an opposite wireless transmission unit by the wireless transmission unit; or receiving local clock information from an opposite wireless transmission unit by the wireless transmission unit.

Considering the varying requirements for the layout of test wires during voltage and current acquisition processes, voltages across different positions of a line may be different in the case of acquisition of multiple voltages, due to the voltage drop of the line. Therefore, during voltage acquisition, it is optimal to acquire multiple voltages at positions as close as possible to a measured object; however, in the case of current acquisition from multiple lines, acquisition points can be farther apart since the same current flows through the same transmission line. Based on this consideration, the electrical parameter measurement and calculation system shown in FIG. 1 of the invention is equipped with the wireless current sensor, the acquired current signal is sent to the electrical parameter measurement and calculation apparatus through the wireless module, the electrical parameter measurement and calculation apparatus is provided with the voltage acquisition module, and a voltage of a nearest position of the measured object is directly measured through a test wire of the voltage acquisition module, so it is not necessary to send the acquired voltage signal in a wireless manner like the wireless current sensor. In this way, due to the characteristics of voltage acquisition, the tangling of test wires will not occur at this end of the electrical parameter measurement and calculation apparatus. In addition, because the electrical parameter measurement and calculation apparatus is provided with the voltage acquisition module, instead of a wireless voltage acquisition module, it is not necessary to equip the voltage acquisition module with a wireless module, nor is it necessary to equip the electrical parameter measurement and calculation apparatus with a wireless module corresponding to the voltage acquisition module, thus greatly reducing the use of wireless modules and reducing the communication data volume between devices and the requirement for synchronization between devices.

As mentioned above, in the embodiments shown in FIGS. 2-5, the wireless current sensor and the electrical parameter measurement and calculation apparatus realize the sampling time synchronization of the voltage signal and the current signal through the wireless module or wireless synchronization unit. In one embodiment, the wireless modules or wireless synchronization units of the wireless current sensor and the electrical parameter measurement and calculation apparatus can accurately realize the sampling time synchronization of the voltage signal and the current signal after obtaining standard time information by using timing devices, such as GNSS and 5G modules. In another embodiment, the wireless module or wireless synchronization unit of the wireless current sensor or the electrical parameter measurement and calculation apparatus adopts a wireless radio frequency module (for example, by means of Bluetooth, 2G, 3G, 4G, 5G, WIFI, sub1G, ZigBee or a custom wireless transmission protocol) to send time information of a local clock to the opposite wireless module or wireless synchronization unit, and then accurately realize the signal sampling time synchronization through corresponding algorithms, or receive the local clock information from the opposite wireless module or wireless synchronization unit to realize the signal sampling time synchronization. The wireless module or wireless synchronization unit adopted features small jitters (such as within 10 μs) and small time delays. The local clock information can be in the form of a series of pulses and/or timestamps. These pulses can directly control the sampling of the analog-to-digital conversion module or control the sampling of the analog-to-digital conversion module after computational processing. For example, when the pulse frequency of wireless transmission and reception is lower than the pulse frequency of actual sampling, the computational processing comprises frequency doubling. The time stamp can express more information about the local clock. For example, the time stamp may contain specific time information, such as date, hour, minute and second, or some agreed numerical serial number, which represents relative time, so as to achieve correct clock synchronization with the opposite end. The time error between the clock information received and restored by the wireless module or wireless synchronization unit of the wireless current sensor and the local clock information sent by the wireless module or wireless synchronization unit of the electrical parameter measurement and calculation apparatus should not exceed 20 μs, or the time error between the clock information received and restored by the wireless module or wireless synchronization unit of the electrical parameter measurement and calculation apparatus and the local clock information sent by the wireless module or wireless synchronization unit of the wireless current sensor should not exceed 20 μs. In this way, the wireless current sensor and the analog-to-digital conversion module of the electrical parameter measurement and calculation apparatus synchronously sample the respective signals at equal intervals, to realize the synchronization of voltage and current signals, thus ensuring the accuracy of electrical parameter calculation, for example, the measurement accuracy of power and/or electric energy is over 2%.

In the embodiments shown in FIGS. 2-5, the wireless current sensor and the electrical parameter measurement and calculation apparatus realize the sending and receiving of the current signal through the wireless module or wireless transmission unit, and the wireless module or wireless transmission unit can realize wireless transmission through Bluetooth, 2G, 3G, 4G, 5G, WIFI, sub1G, ZigBee or a custom wireless transmission protocol.

In the embodiments shown in FIGS. 2-5, the wireless modules of the wireless current sensor and the electrical parameter measurement and calculation apparatus may be the same or different, the wireless synchronization units of the wireless current sensor and the electrical parameter measurement and calculation apparatus may be the same or different, and the wireless transmission units of the wireless current sensor and the electrical parameter measurement and calculation apparatus may be the same or different.

Based on the structure of the above electrical parameter measurement and calculation apparatus, the application also provides an electrical parameter measurement and calculation method, which comprises the following steps.

In step 1, a current signal is received in a wireless manner.

A wireless transmission unit of a wireless module of an electrical parameter measurement and calculation apparatus receives a current signal from a wireless current sensor in a wireless manner, and transmits the current signal to an electrical parameter calculation module of the electrical parameter measurement and calculation apparatus, wherein the wireless transmission can be realized through Bluetooth, 2G, 3G, 4G, 5G, WIFI, sub1G, ZigBee or a custom wireless transmission protocol.

In step 2, a voltage signal is acquired.

A voltage acquisition module of the electrical parameter measurement and calculation apparatus acquires a voltage signal and transmits the voltage signal to the electrical parameter calculation module of the electrical parameter measurement and calculation apparatus. In one embodiment, when the voltages of multiple lines need to be acquired, the voltage acquisition module comprises multiple measurement points, and the voltages of multiple lines can be acquired through the multiple measurement points by sharing a common voltage reference point.

In step 3, electrical parameter information is calculated according to the current signal and the voltage signal.

The electrical parameter calculation module of the electrical parameter measurement and calculation apparatus calculates the electrical parameter information according to the received current signal and voltage signal.

Before the electrical parameter measurement and calculation apparatus and the wireless current sensor acquire and transmit signals, they need to keep the signal sampling time synchronized. In this way, the electrical parameter measurement and calculation method also comprises: performing sampling time synchronization of the voltage signal and the current signal by means of GNSS timing or 5G timing, or transmitting local clock information through a custom wireless transmission protocol or receiving local clock information of an opposite end through a custom wireless transmission protocol to perform sampling time synchronization of the voltage signal and the current signal.

The sampling time synchronization of the voltage signal and the current signal is realized through a wireless module or wireless synchronization unit. In one embodiment, the wireless modules or wireless synchronization units of the wireless current sensor and the electrical parameter measurement and calculation apparatus can accurately realize the sampling time synchronization of the voltage signal and the current signal after obtaining standard time information by using timing devices, such as GNSS and 5G modules. In another embodiment, the wireless module or wireless synchronization unit of the wireless current sensor or the electrical parameter measurement and calculation apparatus adopts a wireless radio frequency module (for example, by means of Bluetooth, 2G, 3G, 4G, 5G, WIFI, sub1G, ZigBee or a custom wireless transmission protocol) to send time information of a local clock to the opposite wireless module or wireless synchronization unit, and then accurately realize the signal sampling time synchronization through corresponding algorithms, or receive the local clock information from the opposite wireless module or wireless synchronization unit to realize the signal sampling time synchronization. The wireless module or wireless synchronization unit features small jitters (such as within 10 μs) and small time delays. The local clock information can be in the form of a series of pulses and/or timestamps. These pulses can directly control the sampling of the analog-to-digital conversion module or control the sampling of the analog-to-digital conversion module after computational processing. For example, when the pulse frequency of wireless transmission and reception is lower than the pulse frequency of actual sampling, the computational processing comprises frequency doubling. The time stamp can express more information about the local clock. For example, the time stamp may contain specific time information, such as date, hour, minute and second, or some agreed numerical serial number, which represents relative time, so as to achieve correct clock synchronization with the opposite end. The time error between the clock information received and restored by the wireless module or wireless synchronization unit of the wireless current sensor and the local clock information sent by the wireless module or wireless synchronization unit of the electrical parameter measurement and calculation apparatus should not exceed 20 μs, or the time error between the clock information received and restored by the wireless module or wireless synchronization unit of the electrical parameter measurement and calculation apparatus and the local clock information sent by the wireless module or wireless synchronization unit of the wireless current sensor should not exceed 20 μs. In this way, the wireless current sensor and the analog-to-digital conversion module of the electrical parameter measurement and calculation apparatus synchronously sample the respective signals at equal intervals, to realize the synchronization of voltage and current signals, thus ensuring the accuracy of electrical parameter calculation, for example, the measurement accuracy of power and/or electric energy is over 2%.

In the embodiments shown in FIGS. 1-5, the electrical parameter measurement and calculation system comprises the wireless current sensor and the electrical parameter measurement and calculation apparatus, that is, the built-in voltage acquisition module of the electrical parameter measurement and calculation apparatus obtains the voltage signal locally, and receives the current signal from the wireless current sensor through wireless transmission. In another embodiment, an electrical parameter measurement and calculation system may comprise a wireless voltage sensor and an electrical parameter measurement and calculation apparatus, that is, a built-in current acquisition module of the electrical parameter measurement and calculation apparatus obtains a current signal locally and receives a voltage signal from the wireless voltage sensor through wireless transmission. The combination of "wireless voltage sensor and electrical parameter measurement and calculation apparatus" is mainly different from that of "wireless current sensor and electrical parameter measurement and calculation apparatus" in electrical signal acquisition, one acquires the current signal through the wireless current sensor, while the other acquires the voltage signal through the wireless voltage sensor, and data transmission and reception, device synchronization, the electrical parameter calculation process and analog-to-digital conversion are basically the same. For example, the wireless voltage sensor performs data (for example, voltage signal) sending and receiving with the wireless transmission unit of the electrical parameter measurement and calculation apparatus through a wireless module or wireless transmission unit; for another example, the wireless modules or wireless synchronization units of the wireless voltage sensor and the electrical parameter measurement and calculation apparatus can accurately realize the signal sampling time synchronization after obtaining standard time information by using timing devices, such as GNSS and 5G modules. Alternatively, the wireless module or wireless synchronization unit of the wireless voltage sensor or the electrical parameter measurement and calculation apparatus adopts a wireless radio frequency module (for example, by means of Bluetooth, 2G, 3G, 4G, 5G, WIFI, sub1G, ZigBee or a custom wireless transmission protocol) to send time information of a local clock to the opposite wireless module or wireless synchronization unit, and then accurately realize the signal sampling time synchronization through corresponding algorithms, or receive the local clock information from the opposite wireless module or wireless synchronization unit to realize the signal sampling time synchronization. For another example, an analog-to-digital conversion module of the wireless voltage sensor and an analog-to-digital conversion module of the electrical parameter measurement and calculation apparatus convert an analog voltage signal or analog current signal into a digital voltage signal or digital current signal under synchronous signal sampling information.

Compared with the combination of "wireless current sensor and electrical parameter measurement and calculation apparatus", the combination of "wireless voltage sensor and electrical parameter measurement and calculation apparatus" has a larger error in voltage measurement due to the voltage drop in the transmission process of the voltage signal, so the voltage signal should be acquired as close as possible to the measured object. The voltage signal is acquired by sharing a common voltage signal reference point. In this way, when three wireless voltage sensors are needed, the common voltage reference point will share three wire clips of the three wireless voltage sensors, which will cause wire clip congestion. However, since the same current flows through the same transmission line, the current signal can be acquired by the electrical parameter measurement and calculation apparatus at any position on the line. For the combination of "wireless current sensor and electrical parameter measurement and calculation apparatus", the current signal can be acquired by establishing a current loop or current clamp around a transmission line, the electrical parameter measurement and calculation apparatus can acquire the voltage signal at a place close to the measured object, and the acquisition of three voltage signals is realized with only four wire clips.

Both combinations can be adopted when one electrical signal needs to be acquired. When multiple electrical signals need to be acquired, the combination of "wireless voltage sensor and electrical parameter measurement and calculation apparatus" will correspond to three wireless voltage sensors and six wire clips, and three of the wire clips share a common voltage reference point, resulting in wire clips congestion. In the combination of "wireless current sensor and electrical parameter measurement and calculation apparatus", the number of wire clips for voltage acquisition is reduced to four, sharing of a common voltage reference point by multiple wire clips is avoided, and the wireless current sensor can select a suitable position to acquire the current signal according to the usage scene, so the combination of "wireless current sensor and electrical parameter measurement and calculation apparatus" is more advantageous. When electricity meter calibration is involved, it is necessary to acquire a pulse signal of a measured electricity meter at the same time and send the pulse signal to the electrical parameter measurement and calculation apparatus for operation, in which case the combination of "wireless current sensor and electrical parameter measurement and calculation apparatus" is also more advantageous.

In this application, the wireless current sensor and the wireless voltage sensor are collectively referred to as "wireless electrical sensors", and accordingly, the voltage acquisition module or current acquisition module of the electrical parameter measurement and calculation apparatus and the current acquisition module or voltage acquisition module in the wireless current sensor or wireless voltage sensor are collectively referred to as "electrical signal acquisition module".

In the embodiments shown in FIGS. 4 and 5, in order to obtain data from the electrical parameter measurement and calculation apparatus and control the operation of the electrical parameter measurement and calculation apparatus, the electrical parameter measurement and calculation apparatus can be provided with a human-computer interaction device. The human-computer interaction device comprises an input apparatus and an output apparatus. The input apparatus can receive input digital or character information as well as key signal input, such as sound input, voice input, touch screen input, and mouse input. The output apparatus may comprise a display device, a sound device, an auxiliary lighting device, and the like. The electrical parameter measurement and calculation apparatus can also communicate with a terminal device in a wired or wireless manner, and a user can input and output feedback through the terminal device, which facilitates user operation.

The technical scheme of the invention can be applied to high-precision devices with electrical parameter measurement and/or electricity meter calibration functions, low-precision devices such as phase voltammeters, and can also be applied to devices such as power quality analyzers, portable PMU synchronous phasor measurement apparatuses, power consumption testers, power analyzers, six-way differential protection vector testers, double clamp grounding resistance testers, storage recorders, portable multifunctional electricity meters, oscilloscopes, and digital multimeters.

A number of embodiments are given below to illustrate the application of the scheme of the invention to specific devices.

Figure 6:
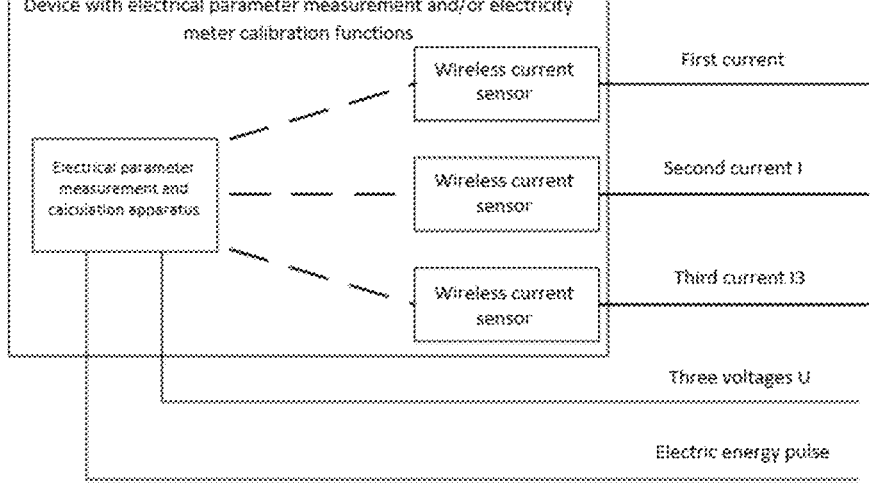
FIG. 6 is a structural diagram of a high-precision device with electrical parameter measurement and/or electricity meter calibration functions according to an embodiment of the invention.

Embodiment 1: High-Precision Device with Electrical Parameter Measurement and/or Electricity Meter Calibration Functions FIG. 6 is a structural diagram of a high-precision device with electrical parameter measurement and/or electricity meter calibration functions according to an embodiment of the invention. As shown in FIG. 6, the device with electrical parameter measurement and/or electricity meter calibration functions comprises an electrical parameter measurement and calculation apparatus and wireless current sensors (one or three wireless current sensors are provided based on whether a measured electricity meter is of a single phase or three phases). The electrical parameter measurement and calculation apparatus and the wireless current sensor synchronize the signal sampling time through their wireless modules or wireless synchronization units respectively. The electrical parameter measurement and calculation apparatus measures analog voltage signals (one or three voltage signals) accessed by the measured electricity meter, converts the analog voltage signals into digital voltage signals through an analog-to-digital conversion module, and then sends them to an electrical parameter calculation module. The wireless current sensor measures an analog current signal accessed by the measured electricity meter under the synchronous signal sampling information, converts the analog current signal into a digital current signal through the analog-to-digital conversion module, and then transmits the digital current signal to a wireless module or wireless transmission unit of the electrical parameter measurement and calculation apparatus through a wireless module or wireless transmission unit. The wireless module or wireless transmission unit of the electrical parameter measurement and calculation apparatus transmits the received current information to the electrical parameter calculation module of the electrical parameter measurement and calculation apparatus. The electrical parameter calculation module calculates standard electrical parameter information (such as voltage, current, inter-voltage phase, inter-current phase, inter-voltage and current phase, frequency, phase sequence, active power, reactive power, apparent power, and power factor) according to the voltage signals tested by the electrical parameter measurement and calculation apparatus and the received current signal, at the same time, the electrical parameter measurement and calculation apparatus reads an electric pulse signal of the measured electricity meter and calculates actual electrical parameter information of the electricity meter according to the electric pulse signal, and the electrical parameter measurement and calculation apparatus calculates and processes the standard electrical parameter information and the actual electrical parameter information to obtain an electric energy metering error of the measured electricity meter.

In this embodiment, the wireless current sensor is used for acquiring the current signal, and the electrical parameter measurement and calculation apparatus is used for acquiring the voltage signal and then calculating electrical parameters, or the wireless voltage sensor is used for acquiring the voltage signal and the electrical parameter measurement and calculation apparatus is used for acquiring the current signal and then calculating electrical parameters. In this embodiment, a wireless pulse receiver can also be used for acquiring a pulse signal.

In an alternative embodiment, the device with electrical parameter measurement and/or electricity meter calibration functions can be provided with a human-computer interaction module, which comprises an input apparatus and an output apparatus. A user directly interacts with the device with electrical parameter measurement and/or electricity meter calibration functions through the input apparatus and the output apparatus.

In another alternative embodiment, the device with electrical parameter measurement and/or electricity meter calibration functions communicates with a terminal device in a wired or wireless manner, and a user can input and output feedback through the terminal device.

FIG. 7 is a structural diagram of another high-precision device with electrical parameter measurement and/or electricity meter calibration functions according to an embodiment of the invention. As shown in FIG. 7, the terminal device can communicate with a marketing system through a mobile network.

This calibration device can also calibrate indicating meters such as a voltmeter, an ammeter, a power meter and a phase meter, as well as various three-phase three-wire, three-phase four-wire or single-phase active and reactive electricity meters.

Embodiment 2: Low-Precision Device Such as Phase Voltammeter

FIG. 8 is a structural diagram of a phase voltammeter according to an embodiment of the invention. As shown in FIG. 8, the phase voltammeter comprises an electrical parameter measurement and calculation apparatus and wireless current sensors (one to three wireless current sensors are provided based on electrical parameters to be measured). The electrical parameter measurement and calculation apparatus and the wireless current sensor synchronize the signal sampling time through their wireless modules or wireless synchronization units respectively. The electrical parameter measurement and calculation apparatus measures analog voltage signals (one to three voltage signals), converts the analog voltage signals into digital voltage signals through an analog-to-digital conversion module, and then sends them to an electrical parameter calculation module. The wireless current sensor measures an analog current signal, converts the analog current signal into a digital current signal through the analog-to-digital conversion module, and then transmits the digital current signal to a wireless module or wireless transmission unit of the electrical parameter measurement and calculation apparatus through a wireless module or wireless transmission unit. The wireless module or wireless transmission unit of the electrical parameter measurement and calculation apparatus transmits the received current information to the electrical parameter calculation module of the electrical parameter measurement and calculation apparatus. An electrical parameter calculation unit completes the measurement of other electrical parameter information (such as inter-voltage phase, inter-current phase, inter-voltage and current phase, frequency, phase sequence, active power, reactive power, apparent power, power factor, and sum of current vectors) according to the voltage signals tested by the electrical parameter measurement and calculation apparatus and the received current signal.

In this embodiment, the wireless current sensor is used for acquiring the current signal, and the electrical parameter measurement and calculation apparatus is used for acquiring the voltage signal and then calculating electrical parameters, or the wireless voltage sensor is used for acquiring the voltage signal and the electrical parameter measurement and calculation apparatus is used for acquiring the current signal and then calculating electrical parameters.

In one embodiment, the phase voltammeter can be provided with a human-computer interaction module. The human-computer interaction module comprises an input apparatus and an output apparatus. A user directly interacts with the phase voltammeter through the input apparatus and the output apparatus.

With the above-mentioned measurement function, the instrument can be used in many fields, mainly including: discrimination of inductive and capacitive circuits; relay protection of the phase relationship between different groups of CT; transformer wiring group inspection; checking of the wiring correctness of electricity meters; checking of the running speed of electricity meters; secondary loop inspection; and being used as a leakage ammeter.

Embodiment 3: Power Quality Analyzer

A power quality analyzer is a device for measuring the power quality of a power system.

Figure 9:
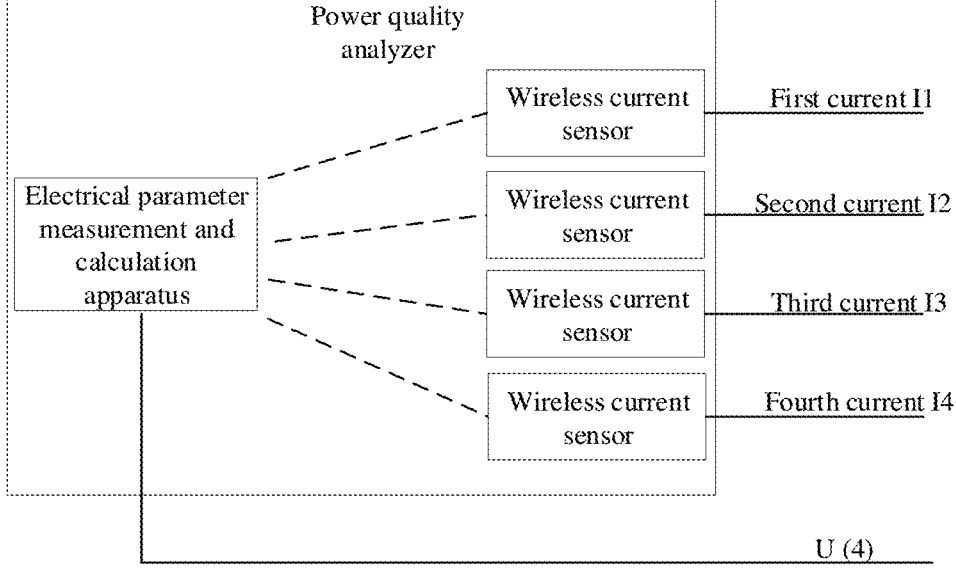
FIG. 9 is a structural diagram of a power quality analyzer according to an embodiment of the invention.

FIG. 9 is a structural diagram of a power quality analyzer according to an embodiment of the invention. As shown in FIG. 9, the power quality analyzer comprises an electrical parameter measurement and calculation apparatus and a wireless current sensor. The wireless current sensor acquires four current signals, namely the current signals of live wires L1, L2, and L3 and a neutral wire, and the electrical parameter measurement and calculation apparatus acquires four voltage signals, namely the voltage signals of the live wires L1, L2, and L3 and the neutral wire. The electrical parameter measurement and calculation apparatus and the wireless current sensor synchronize the signal sampling time through their wireless modules or wireless synchronization units respectively. The electrical parameter measurement and calculation apparatus measures an analog voltage signal accessed by a measured object, converts the analog voltage signal into a digital voltage signal through an analog-to-digital conversion module, and then sends it to an electrical parameter calculation module. The wireless current sensor measures an analog current signal accessed by the measured object under the synchronous signal sampling information, converts the analog current signal into a digital current signal through the analog-to-digital conversion module, and then transmits the digital current signal to a wireless module or wireless transmission unit of the electrical parameter measurement and calculation apparatus through a wireless module or wireless transmission unit. The wireless module or wireless transmission unit of the electrical parameter measurement and calculation apparatus transmits the received current information to the electrical parameter calculation module of the electrical parameter measurement and calculation apparatus. The electrical parameter calculation module calculates power quality information according to the voltage signal tested by the electrical parameter measurement and calculation apparatus and the received current signal.

The power quality analyzer can measure and monitor power quality online in real time. Power quality monitoring indicators include voltage fluctuation and flicker, frequency deviation, harmonics, interharmonics, voltage deviation, overvoltage, overcurrent, voltage sag and short-term interruption, three-phase voltage imbalance, current imbalance, sudden rise and fall, transient state and other power quality parameters. The power quality analyzer can be widely used in power generation, supply and distribution systems for real-time monitoring and measurement of power quality.

Embodiment 4: Portable PMU Synchronous Phasor Measurement Apparatus

A portable PMU synchronous phasor measurement apparatus is an apparatus for measuring and outputting synchronous phasors and dynamically recording them.

Figure 10:
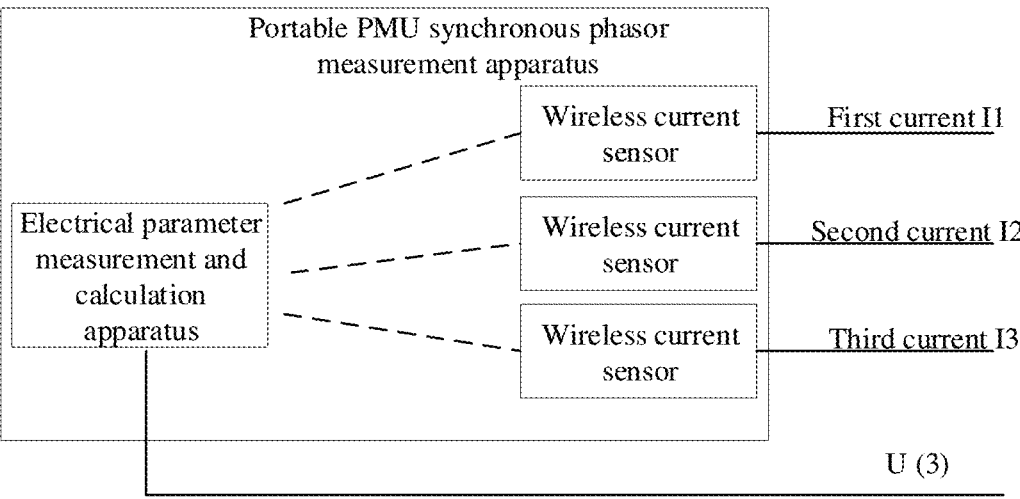
FIG. 10 is a structural diagram of a portable PMU synchronous phasor measurement apparatus according to an embodiment of the invention.

FIG. 10 is a structural diagram of a portable PMU synchronous phasor measurement apparatus according to an embodiment of the invention. As shown in FIG. 10, the portable PMU synchronous phasor measurement apparatus comprises an electrical parameter measurement and calculation apparatus and a wireless current sensor. The wireless current sensor acquires three current signals, and the electrical parameter measurement and calculation apparatus acquires three voltage signals. The electrical parameter measurement and calculation apparatus and the wireless current sensor synchronize the signal sampling time through their wireless modules or wireless synchronization units respectively. The electrical parameter measurement and calculation apparatus measures an analog voltage signal accessed by a measured object, converts the analog voltage signal into a digital voltage signal through an analog-to-digital conversion module, and then sends it to an electrical parameter calculation module. The wireless current sensor measures an analog current signal accessed by the measured object under the synchronous signal sampling information, converts the analog current signal into a digital current signal through the analog-to-digital conversion module, and then transmits the digital current signal to a wireless module or wireless transmission unit of the electrical parameter measurement and calculation apparatus through a wireless module or wireless transmission unit. The wireless module or wireless transmission unit of the electrical parameter measurement and calculation apparatus transmits the received current information to the electrical parameter calculation module of the electrical parameter measurement and calculation apparatus. The electrical parameter calculation module calculates phasor data such as voltage phase and current phase according to the voltage signal tested by the electrical parameter measurement and calculation apparatus and the received current signal. Specific measurement indicators include: three-phase AC current, three-phase AC voltage, AC frequency, AC phase angle, harmonics, inter-harmonics, AC voltage source step mutation, AC current source step mutation, frequency step mutation, phase angle step mutation, amplitude modulation, frequency modulation, phase angle modulation, amplitude and phase angle synchronous modulation, frequency ramp, on-off output and other information.

Embodiment 5: Power Consumption Tester

A power consumption tester is an apparatus for measuring electrical parameters, analyzing CT wiring of a protection circuit and detecting voltage and current imbalance.

The structure of the power consumption tester is similar to that of the phase voltammeter. As shown in FIG. 8, the power consumption tester comprises an electrical parameter measurement and calculation apparatus and a wireless current sensor. Based on different wiring modes, the wireless current sensor acquires one to three current signals, and the electrical parameter measurement and calculation apparatus acquires one to three voltage signals. The electrical parameter measurement and calculation apparatus and the wireless current sensor synchronize the signal sampling time through their wireless modules or wireless synchronization units respectively. The electrical parameter measurement and calculation apparatus measures an analog voltage signal accessed by a measured object, converts the analog voltage signal into a digital voltage signal through an analog-to-digital conversion module, and then sends it to an electrical parameter calculation module. The wireless current sensor measures an analog current signal accessed by the measured object under the synchronous signal sampling information, converts the analog current signal into a digital current signal through the analog-to-digital conversion module, and then transmits the digital current signal to a wireless module or wireless transmission unit of the electrical parameter measurement and calculation apparatus through a wireless module or wireless transmission unit. The wireless module or wireless transmission unit of the electrical parameter measurement and calculation apparatus transmits the received current information to the electrical parameter calculation module of the electrical parameter measurement and calculation apparatus. The electrical parameter calculation module calculates voltage, current, power, phase, imbalance and other information according to the voltage signal tested by the electrical parameter measurement and calculation apparatus and the received current signal. Specific measurement indicators include: AC voltage, AC current, inter-voltage phase, inter-current phase, inter-voltage and current phase, grid frequency, active power, reactive power, apparent power, power factor, harmonics, and information about the correctness of CT wiring, wiring errors of electricity meters, and voltage and current imbalance.

Embodiment 6: Power Analyzer

A power analyzer is an apparatus for measuring the power curve, power consumption and operating efficiency of a device.

The specific structure is shown in FIG. 1. The power analyzer comprises an electrical parameter measurement and calculation apparatus and a wireless current sensor. Based on different wiring modes, the wireless current sensor acquires one to four current signals, and the electrical parameter measurement and calculation apparatus acquires one to four voltage signals. The electrical parameter measurement and calculation apparatus and the wireless current sensor synchronize the signal sampling time through their wireless modules or wireless synchronization units respectively. The electrical parameter measurement and calculation apparatus measures an analog voltage signal accessed by a measured object, converts the analog voltage signal into a digital voltage signal through an analog-to-digital conversion module, and then sends it to an electrical parameter calculation module. The wireless current sensor measures an analog current signal accessed by the measured object under the synchronous signal sampling information, converts the analog current signal into a digital current signal through the analog-to-digital conversion module, and then transmits the digital current signal to a wireless module or wireless transmission unit of the electrical parameter measurement and calculation apparatus through a wireless module or wireless transmission unit. The wireless module or wireless transmission unit of the electrical parameter measurement and calculation apparatus transmits the received current information to the electrical parameter calculation module of the electrical parameter measurement and calculation apparatus. The electrical parameter calculation module calculates voltage and current values, waveforms, harmonics, phasors, trends and other information according to the voltage signal tested by the electrical parameter measurement and calculation apparatus and the received current signal. Specific measurement indicators include: effective values of voltage and current, DC component, AC component, average value of rectification, peak value, peak-to-peak value, crest factor, waveform coefficient, fundamental wave component, fundamental wave content, harmonic distortion, harmonic content, harmonic factor active power, reactive power, apparent power, power factor, phase shift, efficiency, impedance, electric energy, electric quantity, frequency, motor speed, torque, mechanical power, mechanical energy, Δ function, summation function and other information.

According to the wireless electrical sensor, and the electrical parameter measurement and calculation apparatus, method and system provided by the invention, because the wireless module is used for transmitting electrical signals, firstly, the use of test wires is reduced, and the distance to a current and voltage test point is no longer limited by cable length, which makes operation easier, and at the same time avoids potential safety hazards caused by the tangling of test wires and the damage of insulation layers of the test wires; secondly, the electrical parameter measurement and calculation apparatus comprises modules for acquiring part of the electrical signals, so that the number of wireless modules used is reduced while test wires are not added, the layout of the whole electrical parameter measurement and calculation system is more concise, the system is less complicated, the communication between modules in the system is simpler and more efficient, and the cost of the system is reduced; finally, the synchronous signal sampling time information is shared by the electrical parameter measurement and calculation apparatus and the wireless electrical sensor, so as to realize the synchronous sampling of the first electrical signal and the second electrical signal, so that high-precision electrical parameter information can be obtained (for example, the measurement accuracy of power and/or electric energy is over 2%).

The embodiments of the application have been introduced in detail above. Specific examples are applied herein to illustrate the principle and implementation of the application. The above embodiments are only used to help understand the method of the application and its core ideas. All changes or deformations made by those skilled in the art based on the ideas of the application and the specific implementation and application scope of the application are within the scope of protection of the application. To sum up, the content of this specification should not be construed as a limitation of the application.

What is claimed is:

1. An electrical parameter measurement and calculation apparatus, comprising a voltage acquirer, a first wireless communication device, and an electrical parameter calculator integrated together, wherein the first wireless communication device receives a current signal from a wireless current sensor in a wireless manner and transmits the current signal to the electrical parameter calculator, wherein the wireless current sensor transmits the current signal to the electrical parameter measurement and calculation apparatus in a wireless manner;

the voltage acquirer acquires a voltage signal and transmits the voltage signal to the electrical parameter calculator; and the electrical parameter calculator calculates electrical parameter information according to the current signal and the voltage signal; and the apparatus further comprises a first analog-to-digital converter configured to convert an analog voltage signal acquired by the voltage acquirer into a digital voltage signal;

wherein the first analog-to-digital converter receives a time signal of the first wireless communication device, and the first wireless communication device ensures signal sampling time synchronization of the current signal and the voltage signal by:

GNSS timing;

5G timing;

sending local clock information to an opposite second wireless communication device by the first wireless communication device; or receiving local clock information from an opposite second wireless communication device by the first wireless communication device;

wherein the local clock information comprises a series of pulses and/or timestamps, the pulses are used for controlling sampling of the first analog-to-digital converter, and the timestamps are used for expressing information related to a local clock, so as to achieve correct clock synchronization with an opposite end.

2. The apparatus according to claim 1, wherein the first wireless communication device receives the current signal in a wireless manner through Bluetooth, 2G, 3G, 4G, 5G, WIFI, sub1G, ZigBee or a custom wireless transmission protocol.

3. The apparatus according to claim 1, wherein the first wireless communication device comprises a first wireless synchronization unit, the first analog-to-digital converter receives a time signal of the first wireless synchronization unit, and the first wireless synchronization unit ensures signal sampling time synchronization of the current signal and the voltage signal by:

GNSS timing;

5G timing;

sending local clock information to an opposite wireless synchronization unit by the first wireless synchronization unit; or receiving local clock information from an opposite wireless synchronization unit by the first wireless synchronization unit; and wherein the first wireless communication device comprises a first wireless transmission unit, and the first wireless transmission unit receives the current signal in a wireless manner through Bluetooth, 2G, 3G, 4G, 5G, WIFI, sub1G, ZigBee or a custom wireless transmission protocol.

4. A wireless current sensor, comprising:

a current acquirer configured to acquire a current signal;

a second analog-to-digital converter configured to convert an analog current signal acquired by the current acquirer into a digital current signal; and a second wireless communication device configured to receive the acquired current signal and transmit the acquired current signal to an electrical parameter measurement and calculation apparatus in a wireless manner, so that the electrical parameter measurement and calculation apparatus calculates electrical parameter information according to the current signal and a voltage signal acquired by itself;

wherein the second analog-to-digital converter receives a time signal of the second wireless communication device, and the second wireless communication device ensures signal sampling time synchronization of the current signal by:

GNSS timing;

5G timing;

sending local clock information to an opposite first wireless communication device by the second wireless communication device; or receiving local clock information from an opposite first wireless communication device by the second wireless communication device;

wherein the local clock information comprises a series of pulses and/or timestamps, the pulses are used for controlling sampling of the second analog-to-digital converter, and the timestamps are used for expressing information related to a local clock, so as to achieve correct clock synchronization with an opposite end.

5. The wireless current sensor according to claim 4, wherein the second wireless communication device sends the acquired current signal in a wireless manner through Bluetooth, 2G, 3G, 4G, 5G, WIFI, sub1G, ZigBee or a custom wireless transmission protocol.

6. The wireless current sensor according to claim 4, wherein the second wireless communication device comprises a second wireless synchronization unit, the second analog-to-digital converter receives a time signal of the second wireless synchronization unit, and the second wireless synchronization unit ensures signal sampling time synchronization of the current signal by:

GNSS timing;

5G timing;

sending local clock information to an opposite wireless synchronization unit by the second wireless synchronization unit; or receiving local clock information from an opposite wireless synchronization unit by the second wireless synchronization unit; and wherein the second wireless communication device comprises a second wireless transmission unit, and the second wireless transmission unit sends the acquired current signal in a wireless manner through Bluetooth, 2G, 3G, 4G, 5G, WIFI, sub1G, ZigBee or a custom wireless transmission protocol.

7. An electrical parameter measurement and calculation system, comprising an electrical parameter measurement and calculation apparatus comprising a voltage acquirer, a first wireless communication device, and an electrical parameter calculator integrated together, wherein the first wireless communication device receives a current signal from a wireless current sensor in a wireless manner and transmits the current signal to the electrical parameter calculator, wherein the wireless current sensor transmits the current signal to the electrical parameter measurement and calculation apparatus in a wireless manner;

the voltage acquirer acquires a voltage signal and transmits the voltage signal to the electrical parameter calculator; and the electrical parameter calculator calculates electrical parameter information according to the current signal and the voltage signal; and the apparatus further comprises a first analog-to-digital converter configured to convert an analog voltage signal acquired by the voltage acquirer into a digital voltage signal;

and a wireless current sensor comprising a current acquirer configured to acquire a current signal;

a second analog-to-digital converter configured to convert an analog current signal acquired by the current acquirer into a digital current signal; and a second wireless communication device configured to receive the acquired current signal and transmit the acquired current signal to the electrical parameter measurement and calculation apparatus in a wireless manner, so that the electrical parameter measurement and calculation apparatus calculates electrical parameter information according to the current signal and a voltage signal acquired by itself;

wherein the first wireless communication device and the second wireless communication device ensure signal sampling time synchronization of the current signal and the voltage signal by:

GNSS timing;

5G timing;

sending local clock information to the second wireless communication device by the first wireless communication device; or receiving local clock information from the second wireless communication device by the first wireless communication device;

wherein the local clock information comprises a series of pulses and/or timestamps, the pulses are used for controlling sampling of the first analog-to-digital converter and the second analog-to-digital converter, and the timestamps are used for expressing information related to a local clock, so as to achieve correct clock synchronization with an opposite end.

8. The measurement and calculation system according to claim 7, wherein the second wireless communication device receives the acquired current signal and transmits the acquired current signal to the first wireless communication device in a wireless manner through Bluetooth, 2G, 3G, 4G, 5G, WIFI, sub1G, ZigBee or a custom wireless transmission protocol.

9. The measurement and calculation system according to claim 7, wherein the first wireless communication device comprises a first wireless synchronization unit, the second wireless communication device comprises a second wireless synchronization unit, and the electrical parameter measurement and calculation apparatus and the wireless current sensor ensure signal sampling time synchronization of the current signal and the voltage signal through the first wireless synchronization unit and the second wireless synchronization unit; wherein the first wireless synchronization unit and the second wireless synchronization unit ensure the signal sampling time synchronization of the current signal and the voltage signal by:

GNSS timing;

5G timing;

sending local clock information to the second wireless synchronization unit by the first wireless synchronization unit; or receiving local clock information from the second wireless synchronization unit by the first wireless synchronization unit;

the first wireless communication device comprises a first wireless transmission unit, the second wireless communication device comprises a second wireless transmission unit, and the second wireless transmission unit receives the acquired current signal and transmits the acquired current signal to the first wireless transmission unit in a wireless manner; and the wireless transmission is realized through Bluetooth, 2G, 3G, 4G, 5G, WIFI, sub1G, ZigBee or a custom wireless transmission protocol.

* * * * *